(12) United States Patent
Karim et al.

(10) Patent No.: US 7,307,558 B1
(45) Date of Patent: Dec. 11, 2007

(54) DUAL SHIFT REGISTER DATA SERIALIZER

(75) Inventors: Mohammad Mahbubul Karim, Chandler, AZ (US); Arif Alam, Gilbert, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 161 days.

(21) Appl. No.: 11/313,548

(22) Filed: Dec. 20, 2005

(51) Int. Cl.
*H03M 9/00* (2006.01)

(52) U.S. Cl. .................................. 341/100; 710/71

(58) Field of Classification Search ................ 341/100, 341/101; 375/372; 710/71
See application file for complete search history.

(56) References Cited

U.S. PATENT DOCUMENTS

| | | | | |
|---|---|---|---|---|
| 4,079,372 A | * | 3/1978 | Koenig ........................ | 341/100 |
| 5,179,101 A | * | 1/1993 | Huynh-Ba et al. .......... | 544/296 |
| 5,777,567 A | * | 7/1998 | Murata et al. .............. | 341/100 |
| 5,862,367 A | * | 1/1999 | Chiao-Yen ................... | 710/71 |
| 6,782,067 B2 | * | 8/2004 | Boerker ....................... | 375/372 |
| 6,911,843 B2 | * | 6/2005 | Mizumoto et al. ............ | 826/86 |
| 6,970,115 B1 | * | 11/2005 | Sardi et al. ................. | 341/100 |
| 2005/0219083 A1 | * | 10/2005 | Boomer et al. ............. | 341/100 |

\* cited by examiner

*Primary Examiner*—Jean Bruner Jeanglaude
(74) *Attorney, Agent, or Firm*—Brett A. Hertzberg; Merchant & Gould (57) ABSTRACT

A data serializer includes a data aligner, two N-bit shift registers, a 2-1 multiplexer, and a driver, wherein N is the number of parallel input data bits. Data is received and aligned by the data aligner, which is arranged to drive odd and even data lines to a respective one of the N-bit shift registers. One N-bit shift register is arranged to operate with a clock that is 180 degrees out of phase with respect to the other N-bit shift register. The frequency of the clock for each N-bit shift register is related to an input clock frequency by a factor of N/2. The multiplexer is arranged to alternate the selection of the N-bit shift registers to provide the output signal. The output of the multiplexer corresponds to a high-speed serial data stream that can be provided to a driver such as LVDS, DVI, PPDS or RSDS drivers.

20 Claims, 5 Drawing Sheets

DUAL SHIFT REGISTER DATA SERIALIZER

FIELD OF THE INVENTION

The present invention generally relates to circuits and methods of serializing data. More particularly, the present invention is related to a circuit, system, and method for serializing data with two shift registers configured for rapid data throughput.

BACKGROUND

Computer systems and many other electronics systems often store data in a parallel format. The stored data is communicated to other portions within the system with a parallel bus architecture, where each data bit is communicated over a separate communication bus wire. Modern electronics device interfaces have begun to adopt serial communication interfaces as a way of simplifying the interface. Example electronics interfaces that use serial communication topologies include the Universal Serial Bus (USB) Interface, IEEE 1394 "Firewire" Interface, to name a few.

A data serializer is a device that receives parallel data and converts the parallel data into a serial data stream. Data serializers are useful in many devices such as interfacing a USB device to a computer system, where the computer system has a parallel data bus and the USB device communicates with serial data. A wide variety of applications exist for data serializers such as telecommunications, data communications, backplane/cable interconnect applications, and video interface applications, to name a few. Interface circuits are also becoming available for bi-directional communications that includes both serializing and de-serializing functions.

BRIEF DESCRIPTION OF THE DRAWINGS

Non-limiting and non-exhaustive embodiments are described with reference to the following drawings.

DETAILED DESCRIPTION OF THE PREFERRED EMBODIMENT

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, data, or other signal.

Briefly stated, a data serializer includes a data aligner, two N-bit shift registers, a 2-1 multiplexer, and a driver, wherein N is the number of parallel input data bits. Data is received and aligned by the data aligner, which is arranged to drive odd and even data lines to a respective one of the N-bit shift registers. One N-bit shift register is arranged to operate with a clock that is 180 degrees out of phase with respect to the other N-bit shift register. The frequency of the clock for each N-bit shift register is related to an input clock frequency by a factor of N/2. The multiplexer is arranged to alternate the selection of the N-bit shift registers to provide the output signal. The output of the multiplexer corresponds to a high-speed serial data stream that can be provided to a driver such as LVDS, DVI, PPDS or RSDS drivers.

Figure 1:
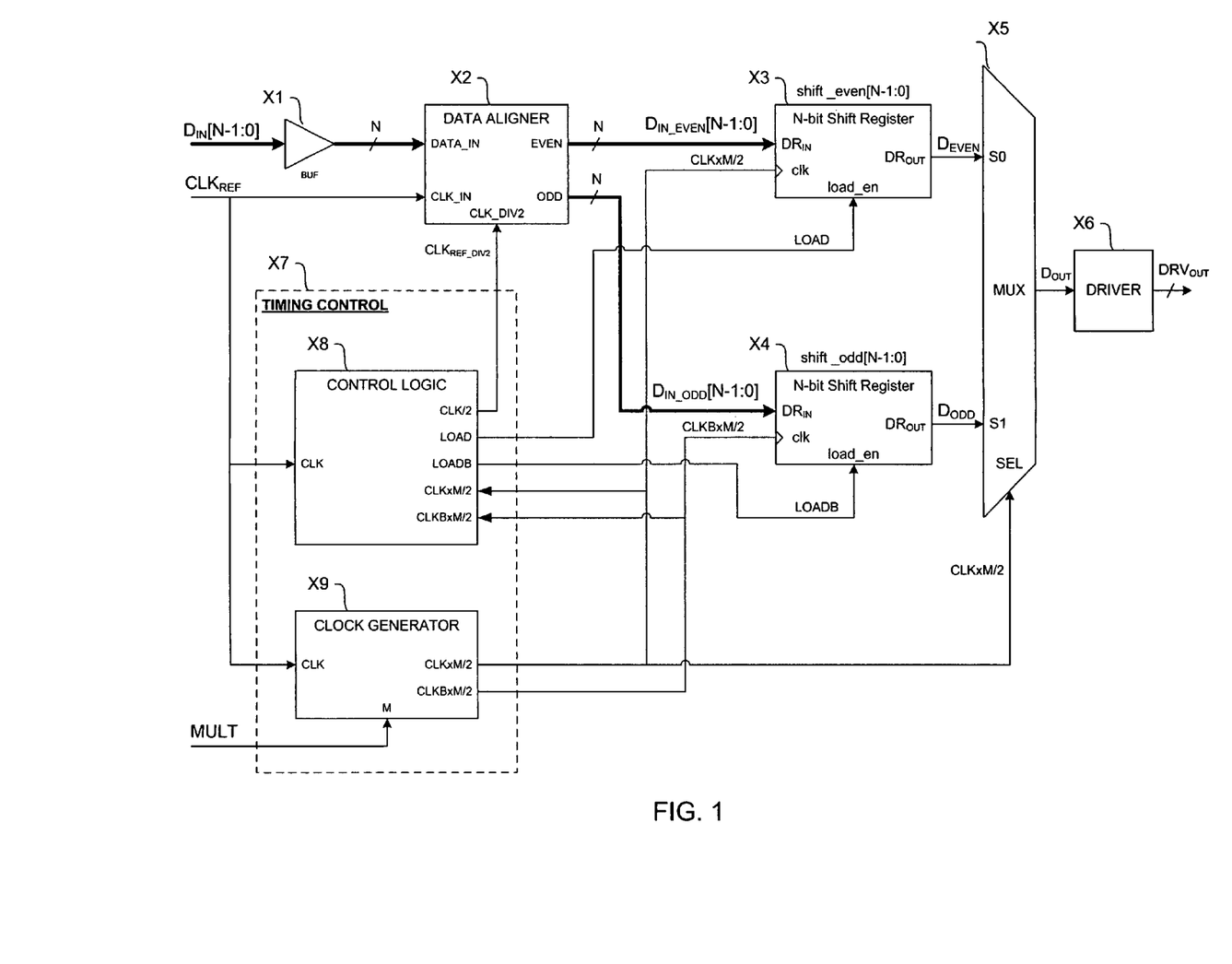
FIG. 1 is a schematic diagram of an example data serializer that is arranged in accordance with the present disclosure.

FIG. 1 is a schematic diagram of an example data serializer that is arranged in accordance with the present disclosure. The data serializer includes a buffer circuit (X1), a data aligner circuit (X2), two shift register circuits (X3 and X4), a multiplexer circuit (X5), and an output driver circuit (X6). A timing and control circuit (X7) is also illustrated, which includes a control logic circuit (X8) and a clock generator circuit (X8).

An N-bit Data ($D_{IN}$) is coupled to the buffer circuit (X1), which is arranged to provide N-bit buffered data to an input terminal (DATA_IN) of the data aligner circuit (X2). The data aligner is arranged to align the input data ($D_{IN}$), responsive to clock signals (e.g., $CLK_{REF}$, $CLK_{REF\_DIV2}$), and provides a first output ($D_{IN\_EVEN}$) and a second output ($D_{IN\_ODD}$), each of which includes N-bits of data. The first N-bit register (X3) includes: a data input terminal ($DR_{IN}$) that is arranged to receive a first portion of the aligned data ($D_{IN\_EVEN}$), a clock input terminal (clk) that is arranged to receive a clock signal (CLKxM/2), a load control terminal (load_en) that is arranged to receive a load control signal (LOAD), and an output terminal ($DR_{OUT}$) that is arranged to provide a first serial data stream ($D_{EVEN}$). The second N-bit register (X4) includes: a data input terminal ($DR_{IN}$) that is arranged to receive a second portion of the aligned data ($D_{IN\_ODD}$), a clock input terminal (clk) that is arranged to receive an inverse clock signal (CLKBxM/2), a load control terminal (load_en) that is arranged to receive an inverse load control signal (LOADB), and an output terminal ($DR_{OUT}$) that is arranged to provide a second serial data stream ($D_{ODD}$). The multiplexer circuit (X5) includes a first input terminal (S0) that is arranged to receive the first serial data stream ($D_{EVEN}$), a second input terminal (S1) that is arranged to receive the second serial data stream ($D_{ODD}$), a control input terminal (SEL) that is arranged to receive a selection control signal (e.g., CLKxM/2), and an output that is arranged to provide an output data stream ($D_{OUT}$). The output driver circuit (X6) includes a first input that is arranged to receive the output data stream ($D_{OUT}$), and an output terminal that is arranged to provide a drive output signal ($DRV_{OUT}$).

The data aligner circuit (X2) and the buffer circuit (X1) may not be necessary in all system implementations. In some embodiments the data aligner circuit (X2) is arranged to receive two consecutive sets of parallel data that are interleaved together. An example 7-bit data path provides a first set of parallel data (A[6:0]) and a second set of parallel data (B[6:0]). For this example, the data aligner circuit (X2) may be configured to receive the two sets of parallel data and provide two outputs that apportion the bits into an EVEN portion (e.g., A[6], A[4], A[2], A[0], B[5], B[3], B[1]) and an ODD portion (e.g., A[5], A[3], A[1], B[6], B[4], B[2], B[0]).

The first N-bit shift register circuit (X3) is arranged to parallel store one of the portions of the aligned data ($D_{IN\_EVEN}$) in response to the load control signal (LOAD) and a clock signal (CLKxM/2). The first N-bit shift register circuit is also arranged to shift previously loaded data to its output terminal (in sequence) in response to the clock signal (CLKxM/2). The second N-bit shift register circuit (X4) is arranged to parallel store the other portion of the aligned data ($D_{IN\_ODD}$) in response to an inverse load control signal (LOADB) and an inverse clock signal (CLKBxM/2). The second N-bit shift register circuit (X4) is also arranged to shift previously loaded data to its output terminal (in sequence) in response to the inverse clock signal (CLKBxM/2).

The multiplexer circuit (X5) is arranged to selectively couple one of the input terminals (S0, S1) to its output terminal in response to the selection control signal (e.g., CLKxM/2). The output signal ($D_{OUT}$) can be either a single ended signal or a differential signal as may be required in some implementations. The driver circuit (X6) is arranged to condition the output signal ($D_{OUT}$) for driving a specified load as signal DRVOUT, which can be in a specified format such as: Universal Serial Bus (USB), Firewire, low-voltage differential signaling (LVDS), digital video interfaces (DVI), point-to-point differential signaling (PPDS), or reduced swing differential signaling (RSDS).

The various clock and control signals can be generated by a timing control circuit (X7), which may include a control logic circuit (X8) and a clock generator circuit (X9). The clock generator circuit (X9) is configured to receive a reference clock signal ($CLK_{REF}$) and generate a clock signal (CLKxM/2) and an inverse clock signal (CLKBxM/2). The clock signal (CLKxM/2) and the inverse clock signal (CLKBxM/2) correspond to a multiplied clock signal relative to the reference clock signal (CLKREF) according to a multiplier factor (M), which can be user provided or preselected by signal MULT. The multiplication factor (M) in a given system is equal to the number of parallel input data bits (N). The control logic circuit (X8) is configured to provide the load control signal (LOAD), the inverse load control signal (LOADB), and a half-clock (CLK/2) signal ($CLK_{REF\_DIV2}$) in response to the reference clock signal ($CLK_{REF}$).

Figure 2A:
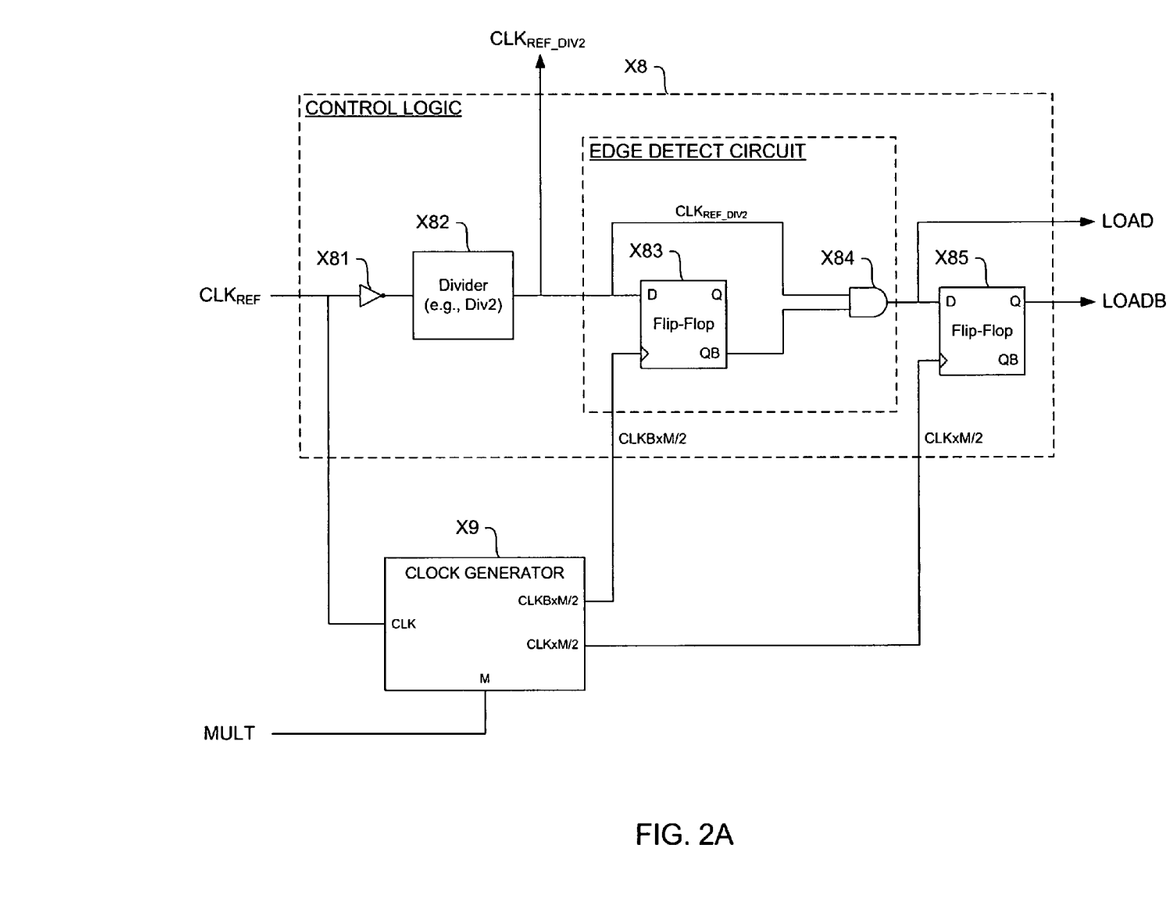
FIGS. 2A and 2B are schematic diagrams of example timing and control circuits that are arranged in accordance with the present disclosure.
Figure 2B:
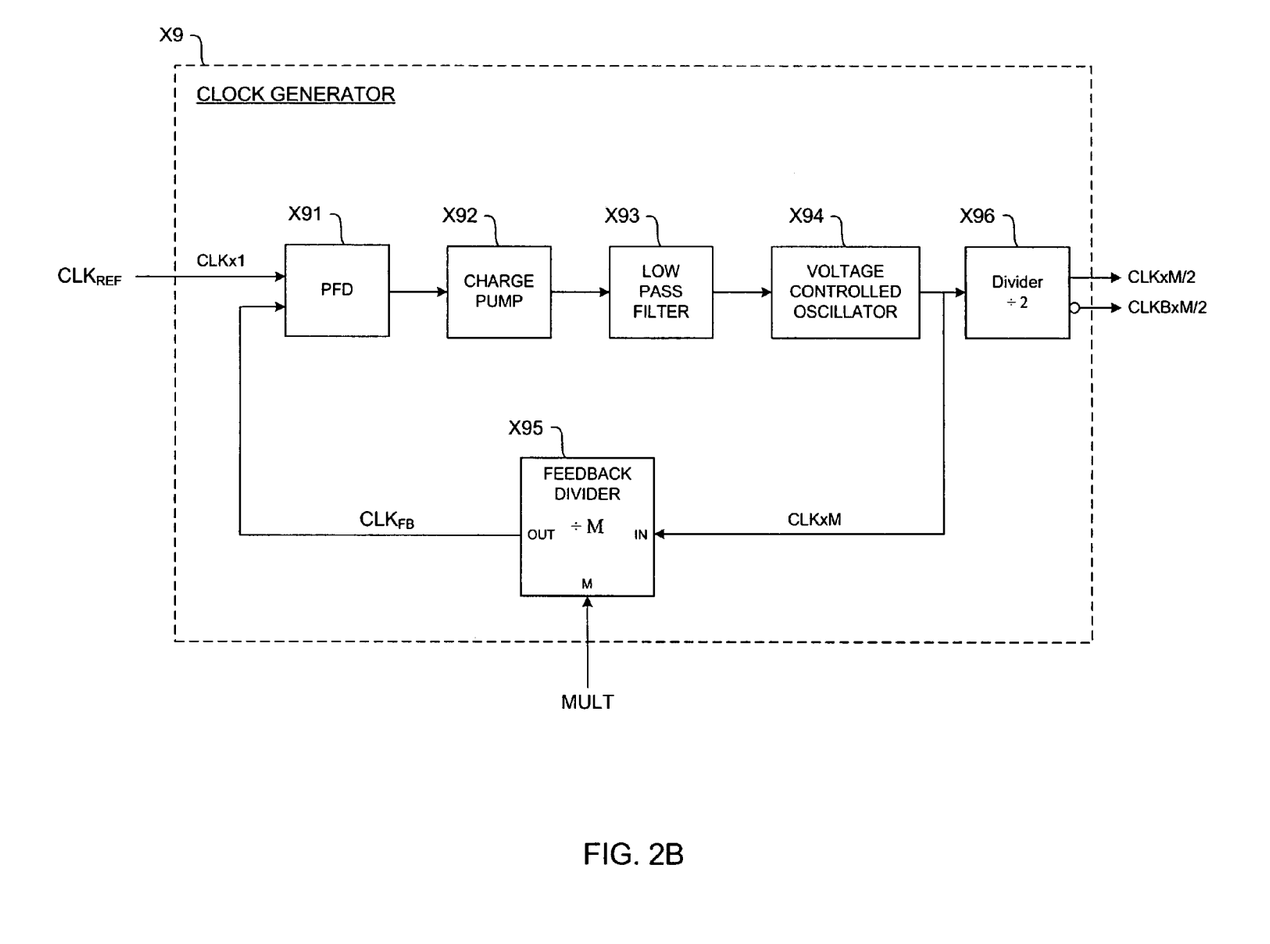

FIG. 2A and FIG. 2B are schematic diagrams of an example timing control circuit (X7) arranged in accordance with the present disclosure. The timing and control circuit includes two portions: a control logic portion (X8) that is illustrated by FIG. 2A, and a clock generator portion (X9) that is illustrated by FIG. 2B. Although illustrated as two portions, a single cohesive circuit may suffice.

The control logic portion (X8) includes: an inverter logic gate (X81), a divider (X82), a first flip-flop (X83), an AND logic gate (X84), and a second flip flop circuit (X85). The inverter logic gate (X81) receives the reference clock signal ($CLK_{REF}$) and provides a buffered clock signal to the divider circuit (X82). The divider circuit (X82) is arranged to divide the input clock from the inverter logic gate (X81) by a division factor (e.g., divide by 2), and provide the divided clock signal (e.g., $CLK_{REF\_DIV2}$) to an input of the first flip-flop circuit (X83). The first flip-flop circuit (X83) is arranged to evaluate the $CLK_{REF\_DIV2}$ signal when triggered by an inverse clock signal (CLKBxM/2), and provides output signals at its Q and QB terminals. The AND logic gate (X84) is arranged to receive the QB output of the first flip-flop circuit (X83) and the $CLK_{REF\_DIV2}$ signal, and arranged to assert its output when the rising edge is detected. The second flip-flop circuit (X84) is arranged to evaluate the output of the AND logic gate (X84) when triggered by a clock signal (CLKxM/2), and provides output signals at its Q and QB terminals. The clock and inverse clock signals can be generated by a clock generator circuit (X9) that operates as previously described above. The LOAD signal is provided as the output of the AND logic gate (X84), while the LOADB signal is provide as the Q output of the second flip-flop circuit (X85). It is important to note that the LOAD signal transitions in response to the inverse clock signal (CLKBxM/2), while the LOADB signal transitions in response to the clock signal (CLKxM/2). The relevance of this transition will be made clear by the Example waveforms described later with respect to FIG. 3B.

The clock generator portion (X9) is arranged as a clock multiplier phase locked loop (PLL) circuit that generates high-speed clock signals CLKxM/2 and CLKBxM/2 from the reference clock signal ($CLK_{REF}$). The multiplication factor (M) for the PLL can be adjustably selected by a multiplier selection signal (MULT), or it can correspond to a predetermined multiplication factor. The multiplication factor (M) in a given system is equal to the number of parallel input data bits (N).

The PLL circuit includes a phase frequency detector (PFD) circuit (X91), a charge pump circuit (X92), a low pass filter circuit (X93), a voltage controlled oscillator (VCO) circuit (X94), and a feedback divider circuit (X95). PFD circuit X91 receives the reference clock signal ($CLK_{REF}$) and compares it to a feedback clock signal ($CLK_{FB}$). The output of PFD circuit X91 is coupled to charge pump circuit X92, which provides an output to low pass filter circuit X93 to generate a signal indicative of any phase frequency differences between the reference clock signal ($CLK_{REF}$) and the feedback clock signal ($CLK_{FB}$). The output of low pass filter circuit X93 is coupled to VCO circuit X94, which provides an output clock signal (CLKxM). The output clock signal (CLKxM) is an input to feedback divider circuit X95, which divides the signal by the multiplication factor (M) to provide the feedback clock signal ($CLK_{FB}$). When the phase and frequency are locked between the feedback clock signal ($CLK_{FB}$) and the reference clock signal ($CLK_{REF}$), the frequency and phase of the output clock signal corresponds to $CLK_{REF}$ multiplied by the multiplication factor M. A divide by two circuit (X96) is arranged to provide complementary clock signals CLKxM/2 and CLKBxM/2 in response to the output clock signal (CLKxM) such that they have a duty cycle that is substantially equal to 50%.

In some embodiments, the clock signal (CLKxM/2) is used as the selection signal for the multiplexer circuit (X5) of FIG. 1. In other embodiments, the inverse clock signal (CLKBxM/2) is used as the selection signal for the multiplexer circuit (X5). In still other embodiments, one of the clock signal and the inverse clock signal are used in conjunction with a delay circuit (not shown), to provide a selection signal to the multiplexer that changes slightly earlier in time than the associated transition in the associated clock signal such that any set-up time associated with the multiplexer is satisfied.

The described data serializer may be useful as a Low Voltage Differential Signaling (LVDS) transmitter. The data serializer receives 2*N-bit parallel data input from two consecutive 1× clock cycles, combines the received data as stored data, and divides the stored data into two N-bit parallel data streams from alternating bits of the stored data (e.g., see FIG. 3B). A first N-bit parallel data stream is loaded into a first one of the shift registers, while the second N-bit parallel data stream is loaded into a second one of the shift registers. The first shift register is arranged to serially shift it's loaded data to a first output for each rising transition of the clock signal, while the second shift register is arranged to serially shift it's loaded data to a second output for each rising transition of the inverse clock signal. The operating speed of the shift registers use a clock speed that is determined by the multiplication factor (M) of the clock generator circuit divided by two. For example, each shift register circuit (X3) is arranged to operate with a speed of $CLK_{REF}*M/2$. The output of the shift registers are then multiplexed using a 2:1 multiplexer circuit to obtain an N*X serial data stream speed. For example, a 7-bit shift register is used to obtain a 7× serial data stream, while a 10-bit shift register would be used to obtain a 10× serial data stream.

Figure 3A:
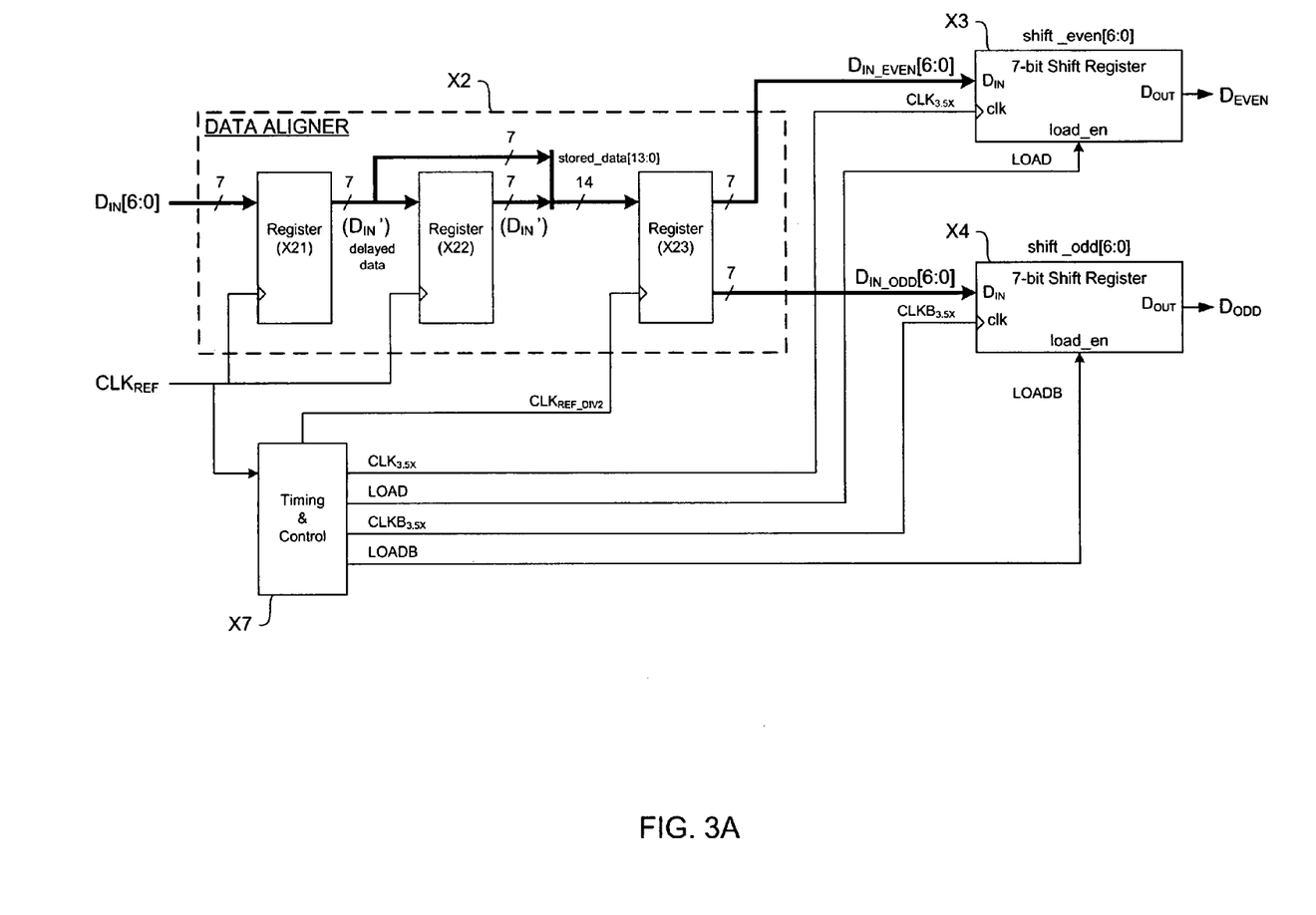
FIG. 3A is a schematic diagram of another example data serializer that is arranged in accordance with the present disclosure.

FIG. 3A is a schematic diagram of another example data serializer that is arranged in accordance with the present disclosure. The data serializer includes a data aligner circuit (X2), two shift register circuits (X3 and X4), and a timing control circuit (X7). The example data serializer of FIG. 3A is arranged as part of a 7-bit system that operates with a clock multiplication factor of M=7, includes 7-bit data input ($D_{IN}$), and has clock signals (e.g., $CLK_{3.5\times}$ and $CLKB_{3.5\times}$) operating at 3.5 times the frequency of the reference clock signal ($CLK_{REF}$).

A detailed example data aligner (X2) is illustrated in FIG. 3A as three registers (X21-X23). The first register (X21) is arranged to register the input data ($D_{IN}$) in response to the rising edge of the reference clock signal ($CLK_{REF}$) as 7-bit delayed data. The second register (X22) is arranged to register the delayed data ($D_{IN}'$) in response to the rising edge of the reference clock signal ($CLK_{REF}$), to provide further delayed data ($D_{IN}''$). The delayed data ($D_{IN}'$) and the further delayed data ($D_{IN}''$) are combined as inputs to the third register as stored_data. The stored_data is registered into the third register (X23) in response to the half clock signal ($CLK_{REF\_DIV2}$) to provide the even and odd pieces of the stored data ($D_{IN\_EVEN}$, $D_{IN\_ODD}$) as inputs to the even and the odd shift registers (X3 and X4), respectively. The even shift register is responsive to signals LOAD and $CLK_{3.5\times}$, while the odd shift register is responsive to signals LOADB and $CLKB_{3.5\times}$.

Figure 3B:
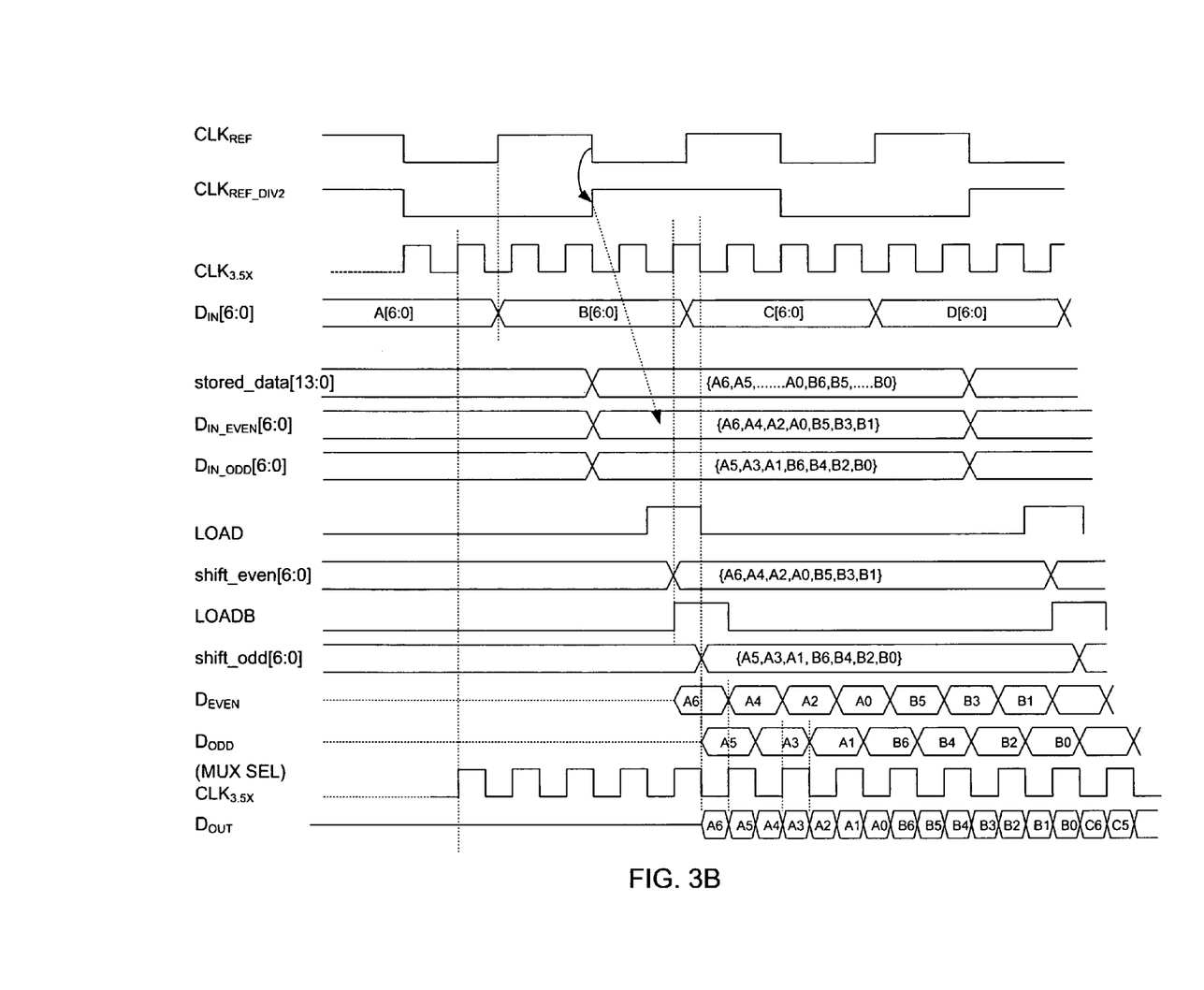
FIG. 3B is a timing diagram for an example data serializer that is arranged in accordance with the present disclosure.

FIG. 3B is a timing diagram for the example data serializer of FIGS. 1 and 3A, which is arranged in accordance with the present disclosure. The timing diagrams illustrate the operation of an example data serializer that operates with 7-bit shift register circuits. The clock signal ($CLK_{3.5\times}$) corresponds to the reference clock signal ($CLK_{REF}$) multiplied by a factor of 3.5×, with the inverse clock signal ($CLKB_{3.5\times}$) being a 3.5× clock that is 180 degrees out of phase with the clock signal.

7-bit input data ($D_{IN}[6:0]$) is loaded into the data aligner resulting in a 14-bit data from 2 consecutive cycles. For example a first 7-bit data transfer from $D_{IN}$ corresponds to A[6:0], while a second 7-bit data transfer from $D_{IN}$ corresponds to B[6:0]. The 14-bit combined data is apportioned into even and odd group that are loaded into one of the two parallel shift register circuits. The $D_{IN\_EVEN}$ signal that is coupled to the first shift register circuit corresponds to parallel data A[6], A[4], A[2], A[0], B[5], B[3], and B[1]. The $D_{IN\_ODD}$ signal that is coupled to the second shift register circuit corresponds to parallel data A[5], A[3], A[1], B[6], B[4], B[2], and B[0].

The $D_{IN\_EVEN}$ parallel data is registered into the first shift register circuit (X3) in response to signal LOAD on the rising edge of signal $CLK_{3.5\times}$, while the $D_{IN\_ODD}$ parallel data is registered into the second shift register in response to signal LOADB on the rising edge of signal $CLKB_{3.5\times}$. The registered data is then serially streamed out of the first shift register circuit (X3) with each subsequent rising edge from signal $CLK_{3.5\times}$. Similarly, the registered data from the second shift register circuit (X4) is serially streamed with each subsequent rising edge from signal $CLKB_{3.5\times}$.

The output of the shift registers are multiplexed with a 2 to 1 multiplexer to provide 7× serial data stream speed. The multiplexer selects one of the shift register outputs in response to the selection control signal (MUX SEL). The selection control signal (MUX SEL) can simply correspond to the clock signal ($CLK_{3.5\times}$), or it can be arranged to transition prior to the transitions in the clock signal ($CLK_{3.5\times}$) using a delay circuit topology to ensure proper setup times are satisfied for the signal path through the multiplexer to the data output stream ($D_{OUT}$). The data output changes on each edge of the selection control signal such that a 7× serial data stream speed is achieved.

As clock speeds are increased, proper load times for the shift registers can become difficult using a modern circuit topology, wherein the multiplexer would be a 7:1 multiplexer. The present disclosure has identified that it is quite difficult to achieve balanced delays between seven (7) signal paths which may result in data pulse position errors, The loading of the shift registers in the preset disclosure is accomplished by a "ping-pong" method that oscillates selection between data streams from the shift registers. The 2:1 multiplexer method described herein utilizes one selection path improving performance and simplifying implementation by eliminating the need to balance delay paths.

The clocking signals in the present disclosure operate at M/2 times the frequency of the reference clock signal, with a resulting output data stream rate of M times the frequency of the reference clock signal. For the above described example implementation, M=7 and the clock signals operate at 3.5× the frequency of the reference clock signal. The output data is streamed at a rate of 7× for this example. Since the shift registers are loaded with a load control signal that is pulsed for one period of the 3.5× clock signal, and shifted by a half cycle relative to the same clock, proper setup and hold times for the shift registers are met. The 2:1 multiplexer also uses the 3.5× clock signal to toggle between the two outputs of the shift registers, thereby obtaining a 7× speed serial data stream.

The above specification, examples and data provide a complete description of the manufacture and use of the composition of the invention. Since many embodiments of the invention can be made without departing from the spirit and scope of the invention, the invention resides in the claims hereinafter appended.

What is claimed is:
1. An apparatus for serializing input data, comprising:
    a timing control circuit that is arranged to provide a first clock in response to a reference clock, and also arranged to provide a second clock in response to the reference clock, wherein the first clock signal and the second clock signal are each operated at a frequency that is substantially M/2 times the reference clock frequency, and wherein M corresponds to a multiplication factor associated with the timing control circuit;

a first shift register circuit that is arranged to load a first N-bits of parallel input data according to a first clock signal at a first time, wherein the first shift register circuit is arranged to provide a first serial data stream that transitions in response to the first clock signal at a second time that is subsequent to the first time;

a second shift register circuit that is arranged to load a second N-bits of parallel input data according to a second clock signal at a third time, wherein the second clock signal substantially 180 degrees out of phase with the first clock signal at the third time, the second time is different from the first time, and wherein the second shift register circuit is arranged to provide a second serial data stream that transitions in response to the second clock signal at a fourth time that is subsequent to the third time; and a multiplexer circuit that is arranged to couple one of the first serial data stream and the second serial data stream to an output node during a first time period, and also couple the other of the first serial data stream and the second serial data stream to the output node during a second time period, such that a serial data stream with a speed corresponding to M times the speed of the reference clock is provided at the output node.

2. The apparatus of claim 1, further comprising a data aligner circuit that is arranged to: receive a first N-bit set of parallel input data with bit values A[N−1] through A[0] during a first time interval, receive a second N-bit set of parallel input data with bit values B[N−1] through B[0] during a second time interval, provide the first N-bits of parallel input data with bit values: A[N−1], A[N−3] ... A[0], B[N−2], B[N−4] ... B[1], and provide the second N-bits of parallel input data with bit values: A[N−2], A[N−4] ... A[1], B[N−1], B[N−3] ... B[0], wherein N is an odd number.

3. The apparatus of claim 1, further comprising a data aligner circuit that is arranged to: receive a first N-bit set of parallel input data with bit values A[N−1] through A[0] during a first time interval, receive a second N-bit set of parallel input data with bit values B[N−1] through B[0] during a second time interval, provide the first N-bits of parallel input data with bit values: A[N−1], A[N−3] ... A[1], B[N−1], B[N−3] ... B[1], and provide the second N-bits of parallel input data with bit values: A[N−2], A[N−4] ... A[0], B[N−2], B[N−4] ... B[0], wherein N is an even number.

4. The apparatus of claim 1, further comprising: a driver circuit that is arranged to receive the serial data stream, and provide a conditioned serial data stream, wherein the conditioned serial data stream is conditioned for one of: a Universal Serial Bus (USB) signal, a Firewire signal, a Low-Voltage Differential Signaling (LVDS) signal, digital video interface (DVI) signal, and a point-to-point differential signaling (PPDS) signal.

5. The apparatus of claim 1, wherein the timing control circuit is arranged to adjust the multiplication factor associated with the first clock signal and the second clock signal relative to the reference clock signal in response to a selectable control signal (MULT).

6. The apparatus of claim 1, wherein the timing control circuit is arranged to assert a load control signal for the first shift register circuit for a pulse period associated with the first clock signal shifted by a half clock cycle, and also arranged to assert an inverse load control signal for the second shift register circuit for a pulse period associated with the second clock signal shifted by another half clock cycle.

7. The apparatus of claim 6, wherein the timing control circuit further comprises: a clock generator circuit and a control logic circuit, wherein the clock generator circuit is arranged to provide the first clock signal and the second clock in response to the reference clock signal, and wherein the control logic circuit is arranged to provide the load control signal and the inverse load control signal.

8. The apparatus of claim 1, wherein the timing control circuit includes a phase-locked loop circuit that is arranged to provide at least one of the first clock signal and the second clock signal in response to the reference clock signal, and wherein the first clock signal and the second clock signal have a duty cycle that is substantially 50%.

9. The apparatus of claim 1, wherein the timing control circuit includes a clock divider circuit and an edge detect circuit, wherein the clock divider circuit is arranged to provide a divided reference clock signal in response to the reference clock signal, and wherein the edge detect circuit is arranged to provide a load control signal for the first shift register circuit in response to the divided reference clock signal and the second clock signal.

10. The apparatus of claim 9, wherein the timing control circuit includes a flip-flop circuit, wherein the flip-flop circuit is arranged to provide an inverse load control signal for the second shift register circuit in response to the first clock signal and the load control signal.

11. An apparatus for serializing input data, comprising:
a clock generator means that is arranged to generate at least one of the clock signal and the inverse clock signal from a reference clock signal such that a frequency associated with the clock signal is matched to M/2 times that for the reference clock signal, and wherein the N-bit data is provided from a data-bus that is operated from the reference clock signal, wherein M corresponds to a multiplication factor;

a first register means that is arranged to register a first N-bits of parallel input data in response to the clock signal when a load control signal is asserted to provide a first N-bits of registered data, wherein the first register means is also arranged to provide a first serial data stream from the first N-bits of registered data, such that the first serial data stream transitions in response to the clock signal;

a second register means that is arranged to register a second N-bits of parallel input in response to the inverse of the clock signal when an inverse of the load control signal is asserted to provide a second N-bits of registered data, and also arranged to provide a second serial data stream from the second N-bits of registered data such that the second serial data stream transitions in response to the inverse of the clock signal;

a multiplexing means that is arranged to provide an output from: the first serial data stream when a selection control signal is asserted, and the second serial data stream when the selection control signal is de-asserted, wherein the selection control signal is operated at substantially the same frequency as the clock signal such that the output corresponds to a serial data stream with a speed of M times the speed of the reference clock signal.

12. The apparatus of claim 11, further comprising: a control logic means that is arranged to generate the load control signal such that: the load control signal has a pulse width that corresponds to a full cycle of the clock signal, and the load control signal is shifted in time relative to the clock signal by approximately one half clock cycle.

13. The apparatus of claim 11, further comprising: a timing control means that is arranged to adjust the data-rate associated with the apparatus by selecting the multiplication factor associated with a phase-locked loop.

14. The apparatus of claim 11, further comprising a timing control means that is arranged to delay transitions in the clock signal relative to transitions in the selection control signal such that the multiplexer means satisfies a set-up time requirement.

15. A method for serializing data, comprising:
capturing a first N-bits of parallel input data in response to a clock signal when a load control signal is asserted to provide a first N-bits of registered data, wherein the clock signal corresponds to a reference clock signal multiplied by a multiplication factor divided by two;
capturing a second N-bits of parallel input data in response to an inverse of the clock signal when an inverse of the load control signal is asserted to provide a second N-bits of registered data;
providing a first serial data stream from the first N-bits of registered data, such that the first serial data stream transitions in response to the clock signal;
providing a second serial data stream from the second N-bits of registered data such that the second serial data stream transitions in response to the inverse of the clock signal;
alternating the selection between the first serial data stream and the second serial stream at a frequency that corresponds to the reference clock signal multiplied by the multiplication factor to provide a selected data stream; and
coupling the selected data stream to an output to provide a serial data stream that corresponds to a serial data pattern from the first serial data stream and the second serial data stream.

16. The method of claim 15, further comprising: conditioning the serial data stream for at least one of: a Universal Serial Bus (USB) signal, a Firewire signal, a Low-Voltage Differential Swing (LVDS) signal, digital video interface (DVI) signal, and a point-to-point differential signaling (PPDS) signal.

17. The method of claim 15, further comprising: adjusting the multiplier factor associated with the clock signal to achieve a desired data throughput rate in response to a user selectable multiplier selection signal.

18. The method of claim 15, further comprising: adjusting the multiplier factor associated with the clock signal to achieve a desired data throughput rate in response to pre-determined multiplication factor.

19. The method of claim 15, further comprising: adjusting the load control signal to ensure the load control signal is asserted prior to a transition in at least one of the clock signal and the inverse of the clock signal.

20. The method of claim 15, further comprising: registering a first input data in response to a rising edge of a reference clock signal to provide delayed data, registering the delayed data in response to another rising edge of the reference clock signal to provide further delayed data, registering the delayed data and the further delayed data in response to a rising edge of a half-clock signal to provide the first N-bits of parallel input data and the second N-bits of parallel input data, wherein the half clock signal corresponds to the reference clock signal divided by two.

* * * * *